United States Patent
Yeh et al.

(10) Patent No.: US 6,514,807 B1
(45) Date of Patent: Feb. 4, 2003

(54) METHOD FOR FABRICATING SEMICONDUCTOR DEVICE APPLIED SYSTEM ON CHIP

(75) Inventors: Yen-hung Yeh, Taoyuan Hsien (TW); Tso-Hung Fan, Taipei Hsien (TW); Hung-Sui Lin, Hsin-Ying (TW); Shih-Keng Cho, Hsinchu (TW); Mu Yi Liu, Taichung (TW); Kwang Yang Chan, Hsinchu (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/955,779

(22) Filed: Sep. 18, 2001

(51) Int. Cl.[7] .............................................. H01L 21/336
(52) U.S. Cl. ...................................... 438/197; 438/381
(58) Field of Search ................................ 438/197, 289, 438/301, 305, 306, 381, 383, 291, 680, 770

(56) References Cited

U.S. PATENT DOCUMENTS 5,362,666 A * 11/1994 Dennison .................... 438/197
5,693,505 A * 12/1997 Kobayashi .................. 438/381
6,017,799 A * 1/2000 Chien et al. ................. 438/291

* cited by examiner

Primary Examiner—David Nelms
Assistant Examiner—David Nhu
(74) Attorney, Agent, or Firm—J. C. Patents

(57) ABSTRACT

The present invention provides a method for fabricating a semiconductor device that can be applied in system on chip (SOC), comprising: providing a substrate with a memory cell region and a peripheral circuit region; forming a plurality of bit-lines in the memory cell region; forming a first and a second dielectric layers respectively in the memory cell region and the peripheral circuit region; and forming a plurality of gates. Next, a blanket ion implantation step is performed to form a plurality of P type LDDs in the substrate besides the gates in a PMOS device region within the peripheral circuit region, without forming an anti-punch through region in the substrate of the memory cell region. Afterwards, a plurality of spacers are formed, connected to one another. An ion implantation step is performed to form a plurality of P type source/drain regions.

14 Claims, 3 Drawing Sheets

METHOD FOR FABRICATING SEMICONDUCTOR DEVICE APPLIED SYSTEM ON CHIP

BACKGROUND OF THE INVENTION

1. Field of Invention

The present invention relates to a method for fabricating a semiconductor device. More particularly, the present invention relates to a method for fabricating a semiconductor device that can be applied in system on chip (SOC).

2. Description of Related Art

In order to fulfill the requirements of lightness, small sizes and multi-functions, fabrication of integrated circuits (ICs) has moved toward system on chip (SOC). That is fabricating read only memory (ROM), static random access memory (SRAM), flash memory or dynamic random access memory (DRAM), together with logic circuits and digital circuits on a single chip.

However, for one single chip including DRAM, flash memory, logic circuits and radio frequency (RF) devices, it is very complicated to design the circuit layout for electrical connection. Furthermore, different fabricating methods are required for devices with different functions. Therefore, it is important to integrate fabricating processes for different devices located on a SOC chip.

FIG. 1 shows the top view for a memory cell region of the prior art SOC chip. FIG. 2 illustrates the cross-sectional view of the prior art SOC chip. As shown in FIG. 2, there are a memory cell region 200 and a peripheral circuit region 202. The memory cell region 200a is the cross-sectional view along line I–I' in FIG. 1, while the memory cell region 200b is the cross-sectional view along line II–II' in FIG. 1.

Referring to FIGS. 1 and 2, a substrate 100 is provided with a memory cell region 200 and a peripheral circuit region 202. In the memory cell region 200, a plurality of bit-lines 102 are formed on the substrate, together with a composite dielectric layer 104, for example, an oxide/nitride/oxide layer, a plurality of gates 108, an anti-punch through region 114 and spacers 116 on sidewalls of the gates 108. In the peripheral circuit region 202, a dielectric layer 106 is formed on the substrate in a PMOS device region within the peripheral circuit region 202, together with a plurality of gates 110, P type lightly doped drains (LDD) 112, source/drain regions 120 and spacers 118 on sidewalls of the gate 110.

In the manufacture processes for the above SOC chip, anisotropic etching is used to removed a portion of the dielectric layer (not shown) in order to form the spacers 116, 118 on the sidewalls of the gates 108, 110. However, over etching occurs in the surface of the substrate in the memory cell region, thus forming silicon recesses 122. Because the surface of the substrate has a higher dopant concentration, silicon recesses result in dopant concentration minus. Therefore, punch-through can happen in the substrate along with silicon recesses, due to dopant concentration minus. As a result, P type ions have to be implanted with high energy to form LDD 112 in the PMOS device region within the peripheral circuit region 202 and anti-punch through regions 114 in the memory cell region 200, at the same time. However, after forming anti-punch through regions 114 in the memory cell region 200, the threshold voltage (Vt) is increased and junction breakdown occurs in the source/drain junction due to diffusion of P-type ions.

SUMMARY OF THE INVENTION

The present invention provides a method for fabricating a semiconductor device that can be applied in system on chip (SOC). The present invention can avoid forming silicon recesses in the memory cell region, so that no anti-punch through implantation is required, thus enhancing device performance.

The present invention provides a method for fabricating a semiconductor device that can be applied in system on chip (SOC), comprising providing a substrate with a memory cell region and a peripheral circuit region; forming a plurality of bit-lines in the memory cell region; forming a first and a second dielectric layers respectively in the memory cell region and the peripheral circuit region; and forming a plurality of gates in the memory cell region and the peripheral circuit region. Next, a blanket ion implantation step is performed to form a plurality of P type LDDs in the substrate besides the gates in a PMOS device region within the peripheral circuit region. The blanket ion implantation step is performed with an energy that is high enough to form P type LDDs in the peripheral circuit region without forming an anti-punch through region in the substrate of the memory cell region. Afterwards, a plurality of spacers are formed on sidewalls of the gates. The spacers formed on the sidewalls of the gates in the memory cell region are connected to one another. An ion implantation step is performed to form a plurality of P type source/drain regions in the substrate besides the gates in the PMOS device region within the peripheral circuit region.

As embodied and broadly described herein, the invention can prevent over-etching in the substrate between the gates in the memory cell region. As the integration of the device increases, the spacers on the sidewalls of the gates connect to one another due to decreased distance between the gates in the memory cell region. Because of protection from the connected spacers, over etching can be prevented, further avoiding silicon recesses. As a result, no anti-punch through implantation is required for the silicon recesses in the memory cell region.

Furthermore, during the ion implantation step for forming P type LDDs in the PMOS device region within the peripheral circuit region, an energy level that is high enough is used to penetrate the surface of the substrate in the PMOS device region within the peripheral circuit region, without penetrating the surface of the substrate in the memory cell region. Therefore, only P type LDDs in the peripheral circuit region are formed, but not forming the anti-punch through region in the memory cell region. As a result, the increased threshold voltage (Vt) and junction breakdown in the source/drain junction due to diffusion of P-type ions can be prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
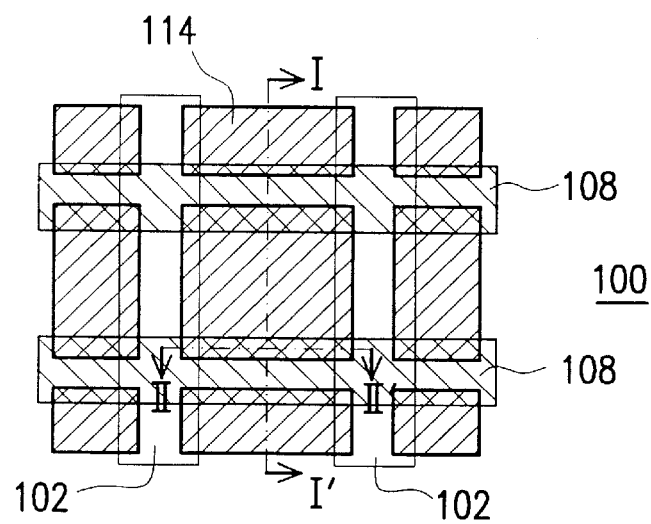
FIG. 1 shows the top view for a memory cell region of the prior art SOC chip.
Figure 2:
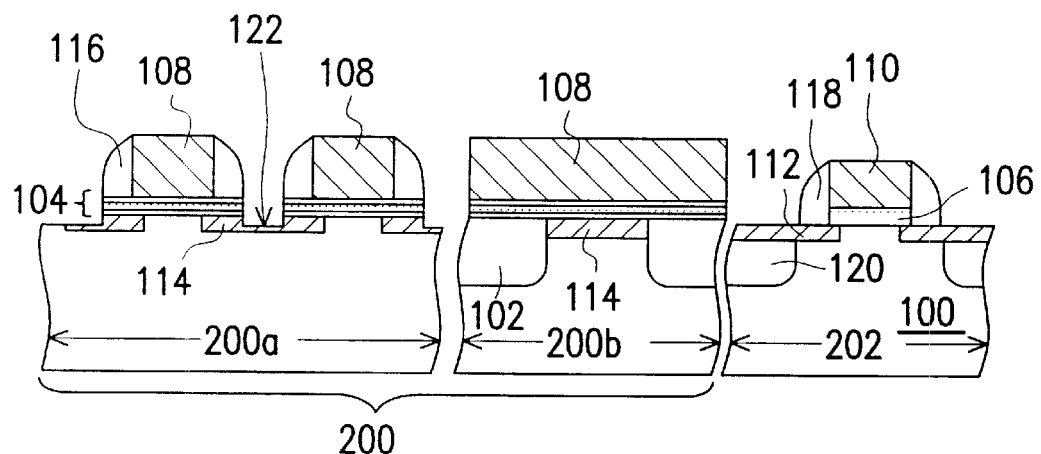
FIG. 2 illustrates the cross-sectional view of the prior art SOC chip.
Figure 3:
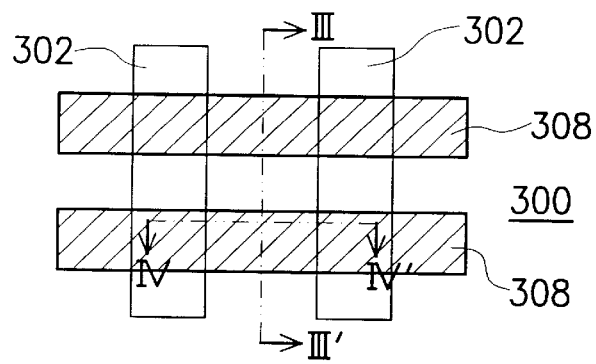
FIG. 3 shows the top view for a memory cell region of a SOC chip according to one preferred embodiment of this invention.
Figure 4A:
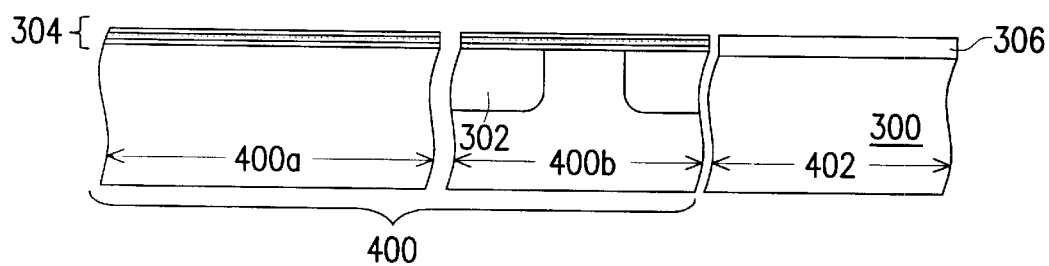
FIGS. 4A to 4C illustrate the cross-sectional view of the process steps for a SOC chip according to one preferred embodiment of this invention.
Figure 4B:
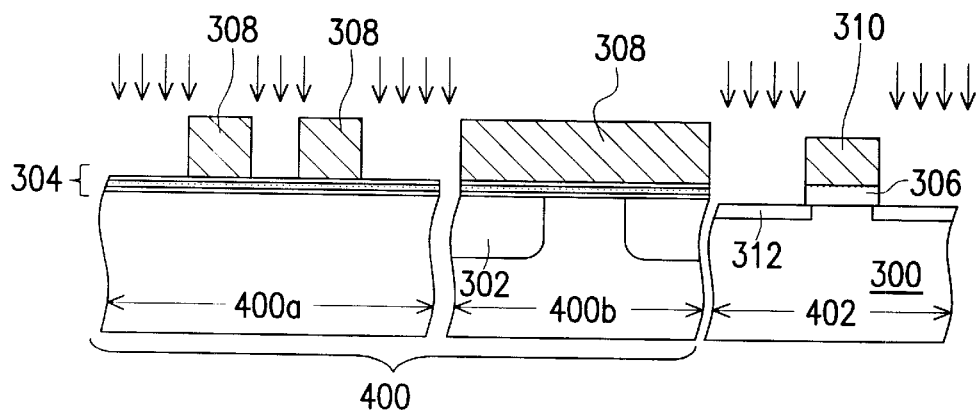
Figure 4C:
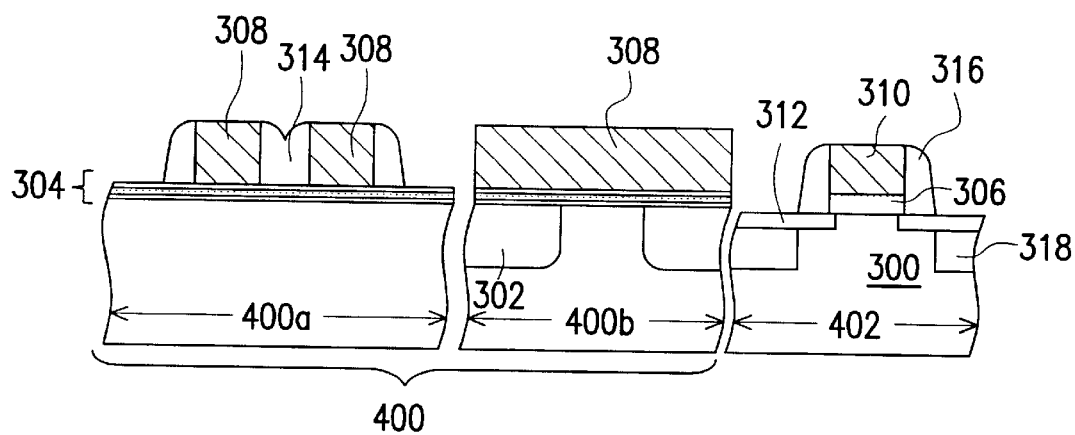

FIG. 3 shows the top view for a memory cell region of a SOC chip according to one preferred embodiment of this invention. FIGS. 4A to 4C illustrate the cross-sectional view of the process steps for a SOC chip according to one preferred embodiment of this invention. As shown in FIGS. 4A and 4C, there are a memory cell region 400 and a peripheral circuit region 402. A memory cell region 400a is drawn from the cross-sectional view along line I–I' in FIG. 3, while a memory cell region 200b is drawn from the cross-sectional view along line III–III' in FIG. 3.

Referring to FIGS. 3 and 4A, a substrate 300 is provided with a plurality of bit-lines 302 formed thereon. For example, a patterned photoresist layer (not shown) covering the peripheral circuit region 402 and predetermined portions of the memory cell region 400a, is formed on the substrate 300, and then an ion implantation step is performed to dope N-type ions into the exposed substrate. After removing the patterned photoresist layer, the bit-lines 302 are formed.

A composite dielectric layer 304 is formed in the memory cell region 400 and a first dielectric layer 306 is formed in the peripheral circuit region 402. For example, the composite dielectric layer 304 can be an oxide/nitride/oxide layer formed by chemical vapor deposition (CVD). For example, the first dielectric layer 306 can be a silicon oxide layer formed by thermal oxidation. The method for forming the composite dielectric layer 304 and the first dielectric layer 306 can include the following steps. A first photoresist layer (not shown) is formed to cover the memory cell region 400 and expose the peripheral circuit region 402. After forming the first dielectric layer 306 on the substrate 300 in the peripheral circuit region 402, remove the first photoresist layer covering the memory cell region 400. Next, a second photoresist layer (not shown) is formed to cover the peripheral circuit region 402 and expose the memory cell region 400. After forming the composite dielectric layer 304 on the substrate 300 in the memory cell region 400, the second photoresist layer covering the peripheral circuit region 402 is removed. On the other hand, the second photoresist layer (not shown) is formed to cover the peripheral circuit region 402 and expose the memory cell region 400. After forming the composite dielectric layer 304 on the substrate 300 in the memory cell region 400, remove the second photoresist layer covering the peripheral circuit region 402. Next, the first photoresist layer (not shown) is formed to cover the memory cell region 400 and expose the peripheral circuit region 402. After forming the first dielectric layer 306 on the substrate 300 in the peripheral circuit region 402, remove the first photoresist layer covering the memory cell region 400.

Referring to FIGS. 3 and 4B, a conductive layer (not shown) is formed on the substrate 300. The conductive layer is, for example, a doped polysilicon layer formed by in-situ doping. For example, the doped polysilicon layer is formed on the substrate 300 by CVD, and then patterned by photolithography to form a plurality of gates 308 in the memory cell region 400 and a plurality of gates 310 in the peripheral circuit region 402.

Using the gates 310 in a PMOS device region within the peripheral circuit region 402, a blanket ion implantation step is performed to dope P-type ions into the substrate besides the gates 310, thus forming P-type lightly doped drains (LDD) 312. The blanket ion implantation step is performed with an implantation energy that is high enough to form LDDs on the sides of the gates 310 in the PMOS device region, but not to form anti-punch through regions in the substrate 300 of the memory cell region 400.

Referring to FIG. 4C, a second dielectric layer (not shown) is formed over the whole substrate 300. The second dielectric layer can be formed of either silicon oxide or silicon nitride, by CVD. A portion of the second dielectric layer is removed to form spacer 314 on sidewalls of the gates 308 in the memory cell region 400 and spacers 316 on sidewalls of the gates 310 in the peripheral circuit region 402. For example, the step for removing a portion of the second dielectric layer includes anisotropic etching. Because the deposited dielectric layer fills up the spacer between the gates 308, the second dielectric layer will not be completely removed during the subsequent step of forming the spacers 314. Therefore, the formed spacers 314 are connected to one another, thus preventing over etching occurred to the substrate 300 between the gates 308. As a result, silicon recesses can be avoided and no anti-punch through is required for the silicon recesses in the memory cell region, as in the prior art.

Afterwards, using the spacers 316 and the gates 310 in the peripheral circuit region as masks, an ion implantation step is performed to dope P-type ions into the substrate 300 besides the gates 310 in the PMOS device region within the peripheral circuit region 402, thus forming source/drain regions 318.

The following processes are well known in the prior art, and thus not described in details.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a semiconductor device that can be applied in system on chip (SOC), comprising:

providing a substrate having a memory cell region and a peripheral circuit region;

forming a plurality of bit-lines in the memory cell region;

forming a first and a second dielectric layers respectively in the memory cell region and the peripheral circuit region;

forming a plurality of gates in the memory cell region and the peripheral circuit region;

performing a ion implantation step to form a plurality of P type lightly doped drains (LDDs) in the substrate besides the gates in a PMOS device region within the peripheral circuit region without forming an anti-punch through region in the substrate of the memory cell region;

forming a plurality of spacers on sidewalls of the gates, wherein the spacers formed on the sidewalls of the gates in the memory cell region are connected to one another; and performing a first ion implantation step to form a plurality of P type source/drain regions in the substrate besides the gates in the PMOS device region within the peripheral circuit region.

2. The method as claimed in claim 1, wherein the first dielectric layer comprises an oxide/nitride/oxide layer.

3. The method as claimed in claim 2, wherein the step for forming the first dielectric layer comprises chemical vapor deposition.

4. The method as claimed in claim 1, wherein a material for forming the second dielectric layer comprises silicon oxide.

5. The method as claimed in claim 4, wherein the step for forming the second dielectric layer comprises thermal oxidation.

6. The method as claimed in claim 1, wherein the step for forming the bit-lines further comprises:

forming a patterned photoresist layer covering the peripheral circuit region and predetermined portions of the memory region; and performing a second ion implantation step to dope N type ions into the substrate, using the patterned photoresist layer as a mask.

7. The method as claimed in claim 1, wherein the step of forming the spacers on the sidewalls of the gates further comprises:

forming a third dielectric layer over the substrate in the memory cell region and the peripheral circuit region; and performing an anisotropic etching process to remove a portion of the third dielectric layer.

8. The method as claimed in claim 1, wherein the step of forming a first and a second dielectric layers respectively in the memory cell region and the peripheral circuit region further comprises:

forming a first photoresist layer to cover the memory cell region and expose the peripheral circuit region;

forming the second dielectric layer on the substrate in the peripheral circuit region;

removing the first photoresist layer;

forming a second photoresist layer to cover the peripheral circuit region and expose the memory cell region;

forming the first dielectric layer on the substrate in the memory cell region; and removing the second photoresist layer.

9. A method for fabricating a semiconductor device that can be applied in system on chip (SOC), comprising:

providing a substrate having a memory cell region and a peripheral circuit region, wherein a plurality of bit-lines and a first dielectric layer are formed in the memory cell region, and wherein a second dielectric layer is formed in the peripheral circuit region;

forming a plurality of gates in the memory cell region and the peripheral circuit region;

forming a plurality of P type lightly doped drains (LDDs) in the substrate besides the gates in a PMOS device region within the peripheral circuit region;

forming a third dielectric layer over the substrate in the memory cell region and the peripheral circuit region, wherein the third dielectric layer fills up voids between the gates in the memory cell region;

performing an anisotropic etching process to remove a portion of the third dielectric layer to form a plurality of spacers on sidewalls of the gates, wherein the spacers formed on the sidewalls of the gates in the memory cell region are connected to one another; and performing an ion implantation step to form a plurality of P type source/drain regions in the substrate besides the gates in the PMOS device region within the peripheral circuit region.

10. The method as claimed in claim 9, wherein an ion implantation step is performed with an energy that is high enough to form P type LDDs in the peripheral circuit region without forming an anti-punch through region in the substrate of the memory cell region.

11. The method as claimed in claim 9, wherein the first dielectric layer comprises an oxide/nitride/oxide layer.

12. The method as claimed in claim 11, wherein the step for forming the first dielectric layer comprises chemical vapor deposition.

13. The method as claimed in claim 9, wherein a material for forming the second dielectric layer comprises silicon oxide.

14. The method as claimed in claim 13, wherein the step for forming the second dielectric layer comprises thermal oxidation.

* * * * *